(12) United States Patent
Lee

(10) Patent No.: US 8,493,813 B2
(45) Date of Patent: Jul. 23, 2013

(54) ROW DECODER CIRCUIT

(75) Inventor: Seung-Won Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 2 days.

(21) Appl. No.: 13/238,816

(22) Filed: Sep. 21, 2011

(65) Prior Publication Data

US 2012/0113740 A1     May 10, 2012

(30) Foreign Application Priority Data

Nov. 9, 2010     (KR) ........................ 10-2010-0110795

(51) Int. Cl.
*G11C 8/08*     (2006.01)
(52) U.S. Cl.
USPC .................................. 365/230.06; 365/230.03
(58) Field of Classification Search
USPC ........................................ 365/230.03, 230.06
See application file for complete search history.

(56) References Cited

U.S. PATENT DOCUMENTS

| | | |
|---|---|---|
| 5,991,198 A | 11/1999 | Song et al. |
| 6,912,157 B2 | 6/2005 | Nakamura et al. |
| 2002/0024873 A1 * | 2/2002 | Tomishima et al. ..... 365/230.06 |

FOREIGN PATENT DOCUMENTS

| | | |
|---|---|---|
| KR | 100250754 | 1/2000 |
| KR | 1020060031174 | 4/2006 |

* cited by examiner

*Primary Examiner* — Michael Tran
(74) *Attorney, Agent, or Firm* — F. Chau & Associates, LLC

(57) ABSTRACT

A row decoder circuit includes a decoding unit and first and second wordline driving units. The decoding unit generates a first driving signal and a second driving signal based on a selection signal and wordline voltages. A voltage level of the first driving signal and a voltage level of the second driving signal depend on an operation mode. The first wordline driving unit is connected to a first wordline and outputs one of the first driving signal and the second driving signal as a first wordline driving signal based on first driving control signals. The second wordline driving unit is connected to a second wordline and outputs one of the first driving signal and the second driving signal as a second wordline driving signal based on second driving control signals.

19 Claims, 9 Drawing Sheets

FIG. 3

|  | DS1 | DS2 | DCS11 | DCS12 | WOUT1 |
|---|---|---|---|---|---|
| SELECTED WORD LINE | 0V | 10V | 10V | -2.5V | 10V |
| UNSELECTED WORD LINE | 0V | 10V | -2.5V | 10V | 0V |

FIG. 4

|  | DS1 | DS2 | DCS11 | DCS12 | WOUT1 |
|---|---|---|---|---|---|
| SELECTED WORD LINE | -6V | 6V | -8.5V | 6V | -6V |
| UNSELECTED WORD LINE | -6V | 6V | 6V | -8.5V | 6V |

ROW DECODER CIRCUIT

CROSS-REFERENCE TO RELATED APPLICATION

This application claims priority under 35 U.S.C. §119 to Korean Patent Application No. 2010-0110795, filed on Nov. 9, 2010 in the Korean Intellectual Property Office (KIPO), the disclosure of which is incorporated by reference herein in its entirety.

BACKGROUND

1. Technical Field

The inventive concept relates to semiconductor memory devices, and more particularly, to a row decoder circuit included in a non-volatile memory device.

2. Discussion of the Related Art

Semiconductor memory devices may retain stored data even when not powered, while others lose their data in the absence of power. Those which lose stored data when not powered are referred to as volatile memory devices, and those which retain stored data when not powered are referred to as non-volatile memory devices.

In general, a semiconductor memory device includes a plurality of memory cells which store data. The semiconductor memory device may further include a row decoder and a column decoder for selecting a memory cell to be programmed, erased or read. The row decoder may select a wordline based on a row address and may select memory cells with the selected wordline. For example, in a non-volatile memory device, the row decoder may provide a program voltage, a read voltage or an erase voltage to the selected wordline depending on an operating mode of the device.

SUMMARY

Exemplary embodiments of the inventive concept provide a row decoder circuit having a simple structure and low power consumption.

According to an exemplary embodiment of the inventive concept, a row decoder circuit includes a decoding unit and first and second wordline driving units. The decoding unit generates a first driving signal and a second driving signal based on a selection signal and wordline voltages. A voltage level of the first driving signal and a voltage level of the second driving signal depend on an operation mode. The first wordline driving unit is connected to a first wordline and outputs one of the first driving signal and the second driving signal as a first wordline driving signal based on first driving control signals. The second wordline driving unit is connected to a second wordline and outputs one of the first driving signal and the second driving signal as a second wordline driving signal based on second driving control signals. The first driving control signals each have a voltage level that is lower than the voltage level of the first driving signal or is about the same as the voltage level of the second driving signal depending on whether the first wordline is selected. The second driving control signals each have a voltage level that is lower than the voltage level of the first driving signal or is about the same as the voltage level of the second driving signal depending on whether the second wordline is selected.

The first wordline driving unit may include a first p-type metal oxide semiconductor (PMOS) transistor and a second PMOS transistor. The first PMOS transistor may have a first electrode connected to the first wordline, a gate electrode receiving a first control signal of the first driving control signals, and a second electrode receiving the first driving signal. The second PMOS transistor may have a first electrode receiving the second driving signal, a gate electrode receiving a second control signal of the first driving control signals, and a second electrode connected to the first electrode of the first PMOS transistor.

The second wordline driving unit may include a third PMOS transistor having a first electrode connected to the second wordline, a gate electrode receiving a first control signal of the second driving control signals, and a second electrode receiving the first driving signal. A fourth PMOS transistor may include a first electrode receiving the second driving signal, a gate electrode receiving a second control signal of the second driving control signals, and a second electrode connected to the first electrode of the third PMOS transistor.

The first control signal of the first or second driving control signals may have one of a first voltage level and a second voltage level, and the second control signal of the first or second driving control signals may have the other of the first voltage level and the second voltage level. The first voltage level may be lower than the voltage level of the first driving signal and the second voltage level may be the same as the voltage level of the second driving signal.

In an exemplary embodiment of the inventive concept, the operation mode may include a program mode, the first driving control signals may include a first and a second control signal, and the second driving control signals may include a first and a second control signal. The first wordline driving unit may output the first driving signal as the first wordline driving signal in response to the first control signal of the first driving control signals having a program control voltage level when the first wordline is not selected in the program mode. The second wordline driving unit may output the first driving signal as the second wordline driving signal in response to the first control signal of the second driving control signals having the program control voltage level when the second wordline is not selected in the program mode. The program control voltage level may be lower than the voltage level of the first driving signal.

The first wordline driving unit may output the second driving signal as the first wordline driving signal in response to the second control signal of the first driving control signals having the program control voltage level when the first wordline is selected in the program mode, and the second wordline driving unit may output the second driving signal as the second wordline driving signal in response to the second control signal of the second driving control signals having the program control voltage level when the second wordline is selected in the program mode.

The second driving signal may have a first program voltage level and the first driving signal may have a second program voltage level in the program mode.

The first control signal of the first driving control signals may have the first program voltage level when the first wordline is selected in the program mode, the second control signal of the first driving control signals may have the first program voltage level when the first wordline is not selected in the program mode, the first control signal of the second driving control signals may have the first program voltage level when the second wordline is selected in the program mode, and the second control signal of the second driving control signals may have the first program voltage level when the second wordline is not selected in the program mode.

In an exemplary embodiment of the inventive concept, the operation mode may include an erase mode, the first driving control signals may include a first and a second control signal, and the second driving control signals may include a first and a second control signal. The first wordline driving unit may output the first driving signal as the first wordline driving signal in response to the first control signal of the first driving control signals having an erase control voltage level when the first wordline is selected in the erase mode, and the second wordline driving unit may output the first driving signal as the second wordline driving signal in response to the first control signal of the second driving control signals having the erase control voltage level when the second wordline is selected in the erase mode. The erase control voltage level may be lower than the voltage level of the first driving signal.

The first wordline driving unit may output the second driving signal as the first wordline driving signal in response to the second control signal of the first driving control signals having the erase control voltage level when the first wordline is not selected in the erase mode, and the second wordline driving unit may output the second driving signal as the second wordline driving signal in response to the second control signal of the second driving control signals having the erase control voltage level when the second wordline is not selected in the erase mode.

The first driving signal may have a first erase voltage level and the second driving signal may have a second erase voltage level in the erase mode.

The first control signal of the first driving control signals may have the second erase voltage level when the first wordline is not selected in the erase mode, the second control signal of the first driving control signals may have the second erase voltage level when the first wordline is selected in the erase mode, the first control signal of the second driving control signals may have the second erase voltage level when the second wordline is not selected in the erase mode, and the second control signal of the second driving control signals may have the second erase voltage level when the second wordline is selected in the erase mode.

The decoding unit may include a first n-type metal oxide semiconductor (NMOS) transistor, a second NMOS transistor and a latch unit. The first NMOS transistor may have a first electrode connected to a first node outputting the second driving signal, a gate electrode receiving the selection signal, and a second electrode connected to a ground voltage. The second NMOS transistor may have a first electrode connected to a second node outputting the first driving signal, a gate electrode receiving an inversion signal of the selection signal, and a second electrode connected to the ground voltage. The latch unit may be connected between a first wordline voltage and a second wordline voltage, and may be connected to the first node and the second node.

All transistors of the first and second wordline driving units may be of the same type.

According to an exemplary embodiment of the inventive concept, a row decoder circuit includes a global decoder and first and second local decoders. The global decoder selects one of global wordlines based on an address signal and generates selection signals corresponding to the global wordlines. The first local decoder is connected to a first global wordline and provides first wordline driving signals to first local wordlines based on a first selection signal, wordline voltages and a first set of driving control signals. The second local decoder is connected to a second global wordline and configured to provide second wordline driving signals to second local wordlines based on a second selection signal, the wordline voltages and a second set of driving control signals. The first local decoder includes a decoding unit and first and second wordline driving units. The decoding unit generates a first driving signal and a second driving signal based on the first selection signal and the wordline voltages. A voltage level of the first driving signal and a voltage level of the second driving signal depend on an operation mode. The first wordline driving unit is connected to a first of the first local wordlines and outputs one of the first driving signal and the second driving signal as a first of the first wordline driving signals based on first driving control signals of the first set of driving control signals. The second driving unit is connected to a second of the first local wordlines and outputs one of the first driving signal and the second driving signal as a second of the first wordline driving signals based on second driving signals of the first set of driving control signals. The first driving control signals of the first set of driving control signals have a voltage level that is lower than the voltage level of the first driving signal or is about the same as the voltage level of the second driving signal depending on whether the first of the first local wordlines is selected. The second driving control signals of the first set of driving control signals have a voltage level that is lower than the voltage level of the first driving signal or is about the same as the voltage level of the second driving signal depending on whether the second of the first local wordlines is selected.

The operation mode may include a program mode. The second driving signal may have a first program voltage level when the first global wordline is selected in the program mode and may have a second program voltage level when the first global wordline is not selected in the program mode. The first driving signal may have the second program voltage level in the program mode.

The operation mode may include an erase mode. The first driving signal may have a first erase voltage level when the first global wordline is selected in the erase mode and may have a second erase voltage level when the first global wordline is not selected in the erase mode. The second driving signal may have the second erase voltage level in the erase mode.

All transistors of the first and second wordline driving units may be of the same type.

According to an exemplary embodiment of the inventive concept, a row decoder includes a decoding unit and first and second word line driving units. The decoding unit generates a first driving signal and a second driving signal based on a selection signal and wordline voltages, the first wordline driving unit outputs one of the first and second driving signals as a first wordline driving signal based on first driving control signals, the second wordline driving unit outputs one and the first and second driving signals as a second wordline driving signal based on second driving control signals, and all transistors of the first and second wordline driving units are of the same type.

A voltage level of each of the first driving control signals is lower than a voltage level of the first driving signal or is about the same as a voltage level of the second driving signal depending on whether a first wordline is selected, and a voltage level of each of the second driving control signals is lower than the voltage level of the first driving signal or is about the same as the voltage level of the second driving signal depending on whether a second wordline is selected.

A voltage level of the first driving signal and a voltage level of the second driving signal may be determined according to an operating mode of a semiconductor device.

The first wordline driving unit may include only two transistors.

BRIEF DESCRIPTION OF THE DRAWINGS

The above and other features of the inventive concept will become more apparent by describing in detail exemplary embodiments thereof with reference to the accompanying drawings.

FIGS. 3 and 4 are tables for describing an operation of the row decoder circuit of FIG. 1, according to an exemplary embodiment of the inventive concept.

DETAILED DESCRIPTION OF THE EMBODIMENTS

Figure 1:
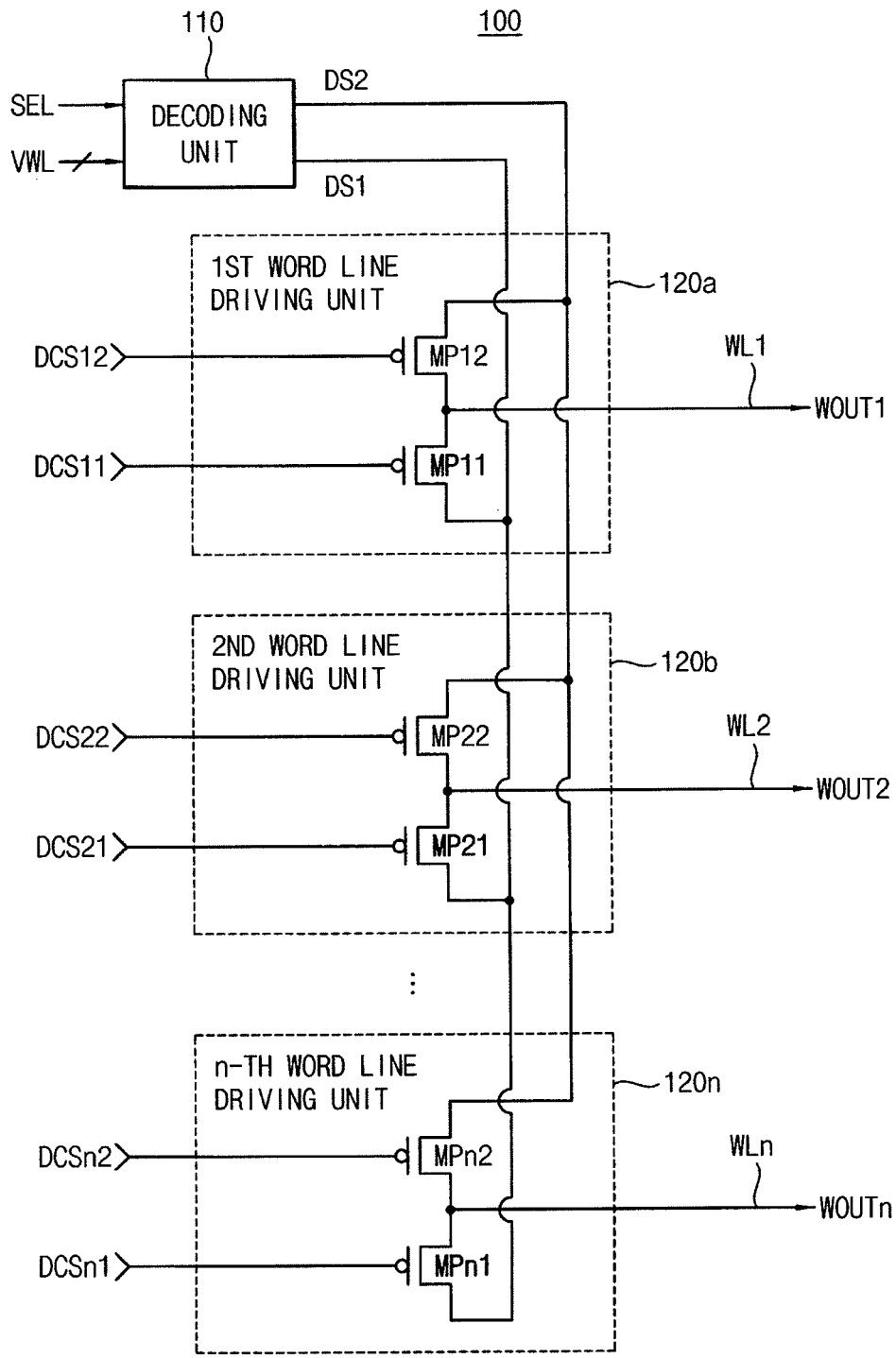
FIG. 1 is a block diagram illustrating a row decoder circuit according to exemplary embodiments of the inventive concept.

Exemplary embodiments of the inventive concept will be described more fully hereinafter with reference to the accompanying drawings. This inventive concept may, however, be embodied in many different forms and should not be construed as limited to the exemplary embodiments set forth herein. Like reference numerals may refer to like elements throughout this application.

It will be understood that when an element is referred to as being "connected" or "coupled" to another element, it can be directly connected or coupled to the other element or intervening elements may be present.

FIG. 1 is a block diagram illustrating a row decoder circuit according to exemplary embodiments of the inventive concept.

Referring to FIG. 1, the row decoder circuit 100 includes a decoding unit 110 and a plurality of wordline driving units 120a, 120b, . . . , 120n.

The row decoder circuit 100 may be employed in a non-volatile memory device that operates in various operation modes. For example, the operation modes of the non-volatile memory device may include a program mode for writing data into a memory cell, a read mode for reading out the data stored in the memory cell, and an erase mode for initializing the memory cell by deleting the stored data. The row decoder circuit 100 provides wordline driving signals WOUT1, WOUT2, . . . , WOUTn to wordlines WL1, WL2, . . . , WLn depending on the operation modes of the non-volatile memory device. Hereinafter, an operation of the row decoder circuit according to exemplary embodiments of the inventive concept will be explained in detail with respect to the program mode and the erase mode.

The decoding unit 110 generates a first driving signal DS1 and a second driving signal DS2 based on a selection signal SEL and wordline voltages VWL. The first driving signal DS1 and the second driving signal DS2 are changed depending on the operation modes of the non-volatile memory device. For example, the second driving signal DS2 may have a first program voltage level and the first driving signal DS1 may have a second program voltage level in the program mode. The first driving signal DS1 may have a first erase voltage level and the second driving signal DS2 may have a second erase voltage level in the erase mode.

The plurality of wordline driving units 120a, 120b, . . . , 120n includes transistors of a single transistor type. For example, each of the wordline driving units 120a through 120n may only include p-type metal oxide semiconductor (PMOS) transistors. Each of the wordline driving units 120a through 120n is connected to a respective one of the wordlines WL1 through WLn. For example, a first wordline driving unit 120a may be connected to a first wordline WL1, a second wordline driving unit 120b may be connected to a second wordline WL2, and an n-th wordline driving unit 120n may be connected to an n-th wordline WLn, where n is a natural number equal to or greater than two.

Each of the wordline driving units 120a through 120n outputs one of the first driving signal DS1 and the second driving signal DS2 as a respective one of the wordline driving signals WOUT1 through WOUTn based on two respective driving control signals DCS11, DCS12, DCS21, DCS22, . . . , DCSn1, DCSn2. Each of the driving control signals DCS11, DCS12, DCS21, DCS22, . . . , DCSn1, DCSn2 has a voltage level that is lower than a voltage level of the first driving signal DS1 or is about the same as a voltage level of the second driving signal DS2 depending on whether the respective one of the wordlines WL1 through WLn is selected.

For example, the first wordline driving unit 120a may output one of the first driving signal DS1 and the second driving signal DS2 as a first wordline driving signal WOUT1 based on a first driving control signal DCS11 and a second driving control signal DCS12. The first driving control signal DCS11 and the second driving control signal DCS12 may have voltage levels that are lower than the voltage level of the first driving signal DS1 or are about the same as the voltage level of the second driving signal DS2 depending on whether the first wordline WL1 is selected, in other words, depending on whether data is written into memory cells (not illustrated) connected to the first wordline WL1 in the program mode or whether the memory cells connected to the first wordline WL1 are initialized in the erase mode. The n-th wordline driving unit 120n may output one of the first driving signal DS1 and the second driving signal DS2 as an n-th wordline driving signal WOUTn based on driving control signals DCSn1 and DCSn2. The voltage levels of the driving signals DS1 and DS2 and the driving control signals DCS11, DCS12, DCS21, DCS22, . . . , DCSn1, DCSn2 will be described later with reference to FIGS. 3 and 4.

In an exemplary embodiment of the inventive concept, a respective one of the driving control signals DCS11, DCS21, . . . , DCSn1 may be complementary to a respective one of the driving control signals DCS12, DCS22, . . . , DCSn2. For example, the first driving control signal DCS11 applied to the first driving unit 120a may be complementary to the second driving control signal DCS12 applied to the first driving unit 120a. The first driving control signal DCS11 may have one of a first voltage level and a second voltage level, and the second driving control signal DCS12 may have the other of the first voltage level and the second voltage level. The first voltage level may be lower than the voltage level of the first driving signal DS1 and the second voltage level may be about the same as the voltage level of the second driving signal DS2. The driving control signals DCSn1 and DCSn2 may be applied to the n-th driving unit 120n, and the driving control signal DCSn1 may be complementary to the driving control signal DCSn2.

In an exemplary embodiment of the inventive concept, each of the wordline driving units 120a through 120n may be implemented with two PMOS transistors that are one of PMOS transistors MP11, MP21, ..., MPn1 and one of PMOS transistors MP12, MP22, ..., MPn2. Each of the PMOS transistors MP11, MP21, ..., MPn1 may have a first electrode connected to the respective one of the wordlines WL1 through WLn, a gate electrode receiving the respective one of the driving control signals DCS11, DCS21, ..., DCSn1, and a second electrode receiving the first driving signal DS1. Each of the PMOS transistors MP12, MP22, ..., MPn2 may have a first electrode receiving the second driving signal DS2, a gate electrode receiving the respective one of the driving control signals DCS12, DCS22, ..., DCSn2, and a second electrode connected to the respective one of the wordlines WL1 through WLn.

For example, the first wordline driving unit 120a may include a first PMOS transistor MP11 and a second PMOS transistor MP12. The first PMOS transistor MP11 may have a first electrode (e.g., a source) connected to the first wordline WL1, a gate electrode receiving the first driving control signal DCS11, and a second electrode (e.g., a drain) receiving the first driving signal DS1. The second PMOS transistor MP12 may have a first electrode (e.g., a source) receiving the second driving signal DS2, a gate electrode receiving the second driving control signal DCS12, and a second electrode (e.g., a drain) connected to the first wordline WL1 (e.g., connected to the first electrode of the first PMOS transistor MP11). Each of the wordline driving units 120b through 120n may have substantially the same structure as the first wordline driving unit 120a.

The row decoder circuit 100 may receive the wordline voltages VWL and the driving control signals DCS11, DCS12, DCS21, DCS22, ..., DCSn1, DCSn2 from a voltage generator (not illustrated) that is disposed inside or outside of the non-volatile memory device. Although the wordline driving units 120a through 120n illustrated in FIG. 1 include only PMOS transistors, the wordline driving units 120a through 120n may include only n-type metal oxide semiconductor (NMOS) transistors.

Typically, a row decoder circuit included in a non-volatile memory device selects a wordline to select a memory cell with the selected wordline. In the program mode, the row decoder circuit provides a first program voltage to the selected wordline to write data into the selected memory cell and provides a second program voltage to the unselected wordlines. In the erase mode, the row decoder circuit provides a first erase voltage to the selected wordline to delete data stored in the selected memory cell and provides a second erase voltage to the unselected wordlines.

In a conventional row decoder circuit, each wordline driving unit is implemented with different types of transistors. For example, each wordline driving unit of the conventional row decoder circuit may include a first PMOS transistor for providing the first program voltage (e.g., a positive high voltage), a first NMOS transistor for providing the second program voltage (e.g., a ground voltage), a second NMOS transistor for providing the first erase voltage (e.g., a negative high voltage) and a second PMOS transistor for providing the second erase voltage (e.g., a positive high voltage). Thus, the conventional row decoder circuit may have a relatively complex structure and high power consumption.

In the row decoder circuit 100 according to exemplary embodiments of the inventive concept, the plurality of wordline driving units 120a through 120n includes transistors of a single transistor type. For example, each of the wordline driving units 120a through 120n may only include two PMOS transistors. Thus, the row decoder circuit 100 may have a relatively simple structure and low power consumption. In addition, the row decoder circuit 100 according to exemplary embodiments of the inventive concept outputs the wordline driving signals WOUT1 through WOUTn based on the driving control signals DCS11, DCS12, DCS21, DCS22, ..., DCSn1, DCSn2. The driving control signals DCS11, DCS12, DCS21, DCS22, ..., DCSn1, DCSn2 may be lower than the first driving signal DS1 or may be the about same as the second driving signal DS2 depending on whether the respective one of the wordlines WL1 through WLn is selected. Thus, the row decoder circuit 100 may provide program voltages or erase voltages to the wordlines WL1 through WLn depending on whether the respective one of the wordlines WL1 through WLn is selected.

Figure 2:
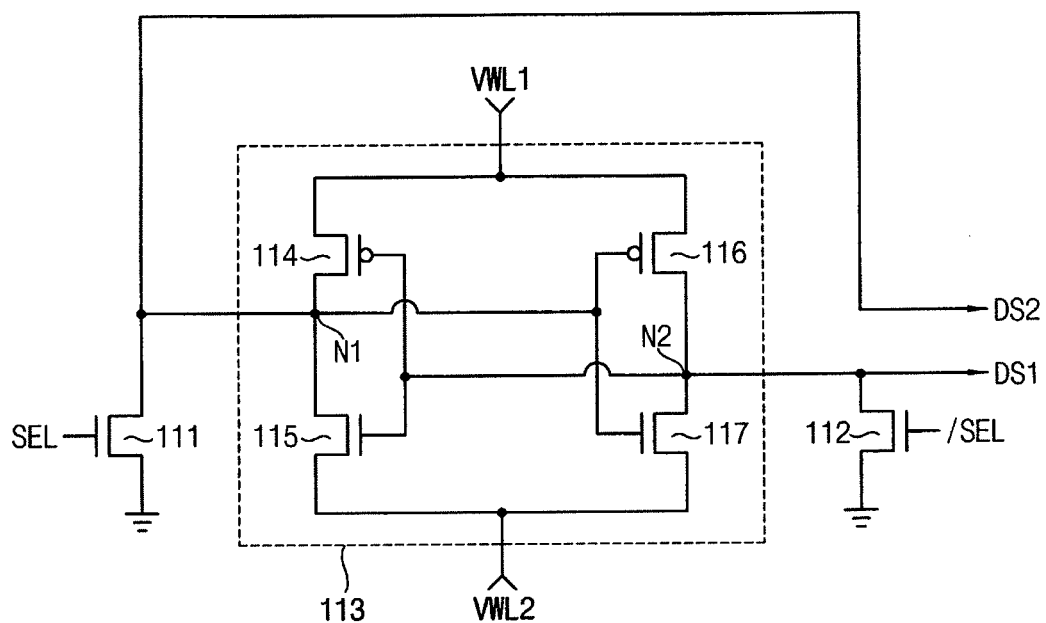
FIG. 2 is a circuit diagram illustrating a decoding unit of FIG. 1, according to an exemplary embodiment of the inventive concept.

FIG. 2 is a circuit diagram illustrating a decoding unit of FIG. 1, according to an exemplary embodiment of the inventive concept.

Referring to FIG. 2, the decoding unit 110a may include a first NMOS transistor 111, a second NMOS transistor 112 and a latch unit 113.

The first NMOS transistor 111 may have a first electrode connected to a first node N1 outputting the second driving signal DS2, a gate electrode receiving the selection signal SEL, and a second electrode connected to a ground voltage. The second NMOS transistor 112 may have a first electrode connected to a second node N2 outputting the first driving signal DS1, a gate electrode receiving an inversion signal/SEL of the selection signal SEL, and a second electrode connected to the ground voltage.

In an exemplary embodiment of the inventive concept, the selection signal SEL may be activated when the non-volatile memory device including the row decoder circuit 100 operates in the program mode or in the erase mode. In an exemplary embodiment of the inventive concept, as described later with reference to FIG. 5, the selection signal SEL may be activated when a global wordline corresponding to the row decoder circuit 100 is selected.

The latch unit 113 may be connected between a first wordline voltage VWL1 and a second wordline voltage VWL2, and may be connected to the first node N1 and the second node N2. The latch unit 113 may include two inverters, where inputs and outputs of the two inverters are cross-coupled. One inverter may be formed with a third PMOS transistor 114 and a third NMOS transistor 115, and another inverter may be formed with a fourth PMOS transistor 116 and a fourth NMOS transistor 117.

The third PMOS transistor 114 may be connected between the first wordline voltage VWL1 and the first node N1. The third NMOS transistor 115 may be connected between the first node N1 and the second wordline voltage VWL2. A gate electrode of the third PMOS transistor 114 and a gate electrode of the third NMOS transistor 115 may be connected to the second node N2. The fourth PMOS transistor 116 may be connected between the first wordline voltage VWL1 and the second node N2. The fourth NMOS transistor 117 may be connected between the second node N2 and the second wordline voltage VWL2. A gate electrode of the fourth PMOS transistor 116 and a gate electrode of the fourth NMOS transistor 117 may be connected to the first node N1.

The decoding unit 110a may output the first wordline voltage VWL1 as the second driving signal DS2, and may output the second wordline voltage VWL2 as the first driving signal DS1. The voltage levels of the first driving signal DS1 and the second driving signal DS2 may be changed depending on the operation modes of the non-volatile memory device and a logic level of the selection signal SEL. For example, when the selection signal SEL is activated, the second driving signal DS2 may have the first program voltage level and the first driving signal DS1 may have the second program voltage level in the program mode. When the selection signal SEL is activated, the first driving signal DS1 may have the first erase voltage level and the second driving signal DS2 may have the second erase voltage level in the erase mode. When the selection signal SEL is deactivated, the first driving signal DS1 and the second driving signal DS2 may have the second program voltage level in the program mode, and may have the second erase voltage level in the erase mode.

FIGS. 3 and 4 are tables for describing an operation of the row decoder circuit of FIG. 1, according to an exemplary embodiment of the inventive concept. FIG. 3 indicates voltage levels of input signals and output signals for the first wordline driving unit 120a in the program mode. FIG. 4 indicates voltage levels of input signals and output signals for the first wordline driving unit 120a in the erase mode.

Hereinafter, the operation of the row decoder circuit 100 in the program mode will be described with reference to FIGS. 1, 2 and 3.

As described above with reference FIG. 2, when the selection signal SEL is activated, the second driving signal DS2 has the first program voltage level, and the first driving signal DS1 has the second program voltage level in the program mode. For example, the first program voltage level may be about 10V and the second program voltage level may be about 0V.

The voltage levels of the first and second driving control signals DCS11 and DCS12 are determined by a memory controller (not illustrated). When the first wordline WL1 is selected, in other words, when data is written into a memory cell connected to the first wordline WL1, the first driving control signal DCS11 has the first program voltage level (e.g., about 10V) that is substantially the same as the voltage level of the second driving signal DS2, and the second driving control signal DCS12 has a program control voltage level that is lower than the voltage level of the first driving signal DS1. For example, the program control voltage level may be about −2.5V. The first PMOS transistor MP11 is turned off, the second PMOS transistor MP12 is turned on, and thus, the first wordline driving unit 120a outputs the second driving signal DS2 as the first wordline driving signal WOUT1 by using the second PMOS transistor MP12. The first wordline driving signal WOUT1 has the first program voltage level (e.g., about 10V).

When the first wordline WL1 is selected, the other wordlines WL2 through WLn are unselected and the voltage levels of the other driving control signals DCS21, DCS22, . . . DCSn1, DCSn2 are determined by the memory controller. The driving control signals DCS21, . . . , DCSn1 corresponding to the first driving control signal DCS11 have the program control voltage level (e.g., about −2.5V), and the driving control signals DCS22, . . . , DCSn2 corresponding to the second driving control signal DCS12 have the first program voltage level (e.g., about 10V). The PMOS transistors MP21, . . . , MPn1 corresponding to the first PMOS transistor MP11 are turned on, the PMOS transistors MP22, . . . , MPn2 corresponding to the second PMOS transistor MP12 are turned off, and thus, the other wordline driving units 120b through 120n output the first driving signal DS1 as the wordline driving signals WOUT2 through WOUTn, respectively. The wordline driving signals WOUT2 through WOUTn have the second program voltage level (e.g., about 0V), respectively.

When the first wordline WL1 is unselected, in other words, when data is not written into the memory cell connected to the first wordline WL1, the first driving control signal DCS11 has the program control voltage level (e.g., about −2.5V), and the second driving control signal DCS12 has the first program voltage level (e.g., about 10V). The first PMOS transistor MP11 is turned on, the second PMOS transistor MP12 is turned off, and thus, the first wordline driving unit 120a outputs the first driving signal DS1 as the first wordline driving signal WOUT1 by using the first PMOS transistor MP11. The first wordline driving signal WOUT1 has the second program voltage level (e.g., about 0V).

When the first wordline WL1 is unselected and the second wordline WL2 is selected, the driving control signal DCS21 has the first program voltage level (e.g., about 10V), and the driving control signal DCS22 has the program control voltage level (e.g., about −2.5V), and thus, the second wordline driving unit 120b outputs the second driving signal DS2 as the second wordline driving signal WOUT2 by using the PMOS transistor MP22. The other wordline driving units that are connected to unselected wordlines operate similarly to the first wordline driving unit 120a.

In an exemplary embodiment of the inventive concept, the first program voltage level, the second program voltage level and the program control voltage level may be any voltage levels. For example, the first program voltage level may be any positive high voltage level, the second program voltage level may be any positive or negative voltage level that is lower than the first program voltage level, and the program control voltage level may be any voltage level that is lower than the second program voltage level.

In the row decoder circuit 100 according to an exemplary embodiment of the inventive concept, each of the wordline driving units 120a through 120n is implemented with only two PMOS transistors, and outputs the first driving signal DS1 as the respective one of the wordline driving signals WOUT1 through WOUTn based on the respective one of the driving control signals DCS11, DCS21, . . . , DCSn1 when the respective one of the wordlines WL1 through WLn is unselected in the program mode. The first driving signal DS1 has the second program voltage level (e.g., about 0V), and the respective one of the driving control signals DCS11, DCS21, . . . , DCSn1 has the program control voltage level (e.g., about −2.5V) when the respective one of the wordlines WL1 through WLn is unselected in the program mode. Thus, the unselected wordlines are not floated in the program mode, and the row decoder circuit 100 provides the wordline driving signals having the second program voltage level (e.g., about 0V) to the unselected wordlines.

Hereinafter, the operation of the row decoder circuit 100 in the erase mode will be described with reference to FIGS. 1, 2 and 4.

As described above with reference FIG. 2, when the selection signal SEL is activated, the first driving signal DS1 has the first erase voltage level, and the second driving signal DS2 has the second erase voltage level in the erase mode. For example, the first erase voltage level may be about −6V and the second erase voltage level may be about 6V.

When the first wordline WL1 is selected, in other words, when data stored in the memory cell connected to the first wordline WL1 is deleted, the first driving control signal DCS11 has an erase control voltage level that is lower than the voltage level of the first driving signal DS1, and the second driving control signal DCS12 has the second erase voltage level (e.g., about 6V) that is substantially the same as the voltage level of the second driving signal DS2. For example, the erase control voltage level may be about −8.5V. The first PMOS transistor MP11 is turned on, the second PMOS transistor MP12 is turned off, and thus, the first wordline driving unit 120a outputs the first driving signal DS1 as the first wordline driving signal WOUT1 by using the first PMOS transistor MP11. The first wordline driving signal WOUT1 has the first erase voltage level (e.g., about −6V).

When the first wordline WL1 is selected, in other words, the other wordlines WL2 through WLn are unselected, the driving control signals DCS21, ..., DCSn1 corresponding to the first driving control signal DCS11 have the second erase voltage level (e.g., about 6V), and the driving control signals DCS22, ..., DCSn2 corresponding to the second driving control signal DCS12 have the erase control voltage level (e.g., about −8.5V). The PMOS transistors MP21, ..., MPn1 corresponding to the first PMOS transistor MP11 are turned off, the PMOS transistors MP22, ..., MPn2 corresponding to the second PMOS transistor MP12 are turned on, and thus, the other wordline driving units 120b through 120n output the second driving signal DS2 as the wordline driving signals WOUT2 through WOUTn, respectively. The wordline driving signals WOUT2 through WOUTn have the second erase voltage level (e.g., about 6V), respectively.

When the first wordline WL1 is unselected, in other words, when data stored in the memory cell connected to the first wordline WL1 is not deleted, the first driving control signal DCS11 has the second erase voltage level (e.g., about 6V), and the second driving control signal DCS12 has the erase control voltage level (e.g., about −8.5V). The first PMOS transistor MP11 is turned off, the second PMOS transistor MP12 is turned on, and thus, the first wordline driving unit 120a outputs the second driving signal DS2 as the first wordline driving signal WOUT1 by using the second PMOS transistor MP12. The first wordline driving signal WOUT1 has the second erase voltage level (e.g., about 6V).

When the first wordline WL1 is unselected and the second wordline WL2 is selected, the driving control signal DCS21 has the erase control voltage level (e.g., about −8.5V), and the driving control signal DCS22 has the second erase voltage level (e.g., about 6V), and thus, the second wordline driving unit 120b outputs the first driving signal DS1 as the second wordline driving signal WOUT2 by using the PMOS transistor MP21. The other wordline driving units that are connected to unselected wordlines operate similarly to the first wordline driving unit 120a.

In an exemplary embodiment of the inventive concept, the first erase voltage level, the second erase voltage level and the erase control voltage level may be any voltage levels. For example, the first erase voltage level may be any negative high voltage level, and the second erase voltage level may be any positive high voltage level. In addition, the first erase voltage level may be any positive voltage level, and the second erase voltage level may be any positive high voltage level that is higher than the first erase voltage level. The erase control voltage level may be any voltage level that is lower than the first erase voltage level.

In the row decoder circuit 100 according to exemplary embodiments of the inventive concept, each of the wordline driving units 120a through 120n outputs the first driving signal DS1 as the respective one of the wordline driving signals WOUT1 through WOUTn based on the respective one of the driving control signals DCS11, DCS21, ..., DCSn1 when the respective one of the wordlines WL1 through WLn is selected in the erase mode. The first driving signal DS1 has the first erase voltage level (e.g., about −6V), and the respective one of the driving control signals DCS11, DCS21, ..., DCSn1 has the erase control voltage level (e.g., about −8.5V) when the respective one of the wordlines WL1 through WLn is selected in the erase mode. Thus, the selected wordline is not floated in the erase mode, and the row decoder circuit 100 provides the wordline driving signal having the first erase voltage level (e.g., about −6V) to the selected wordline.

Figure 5:
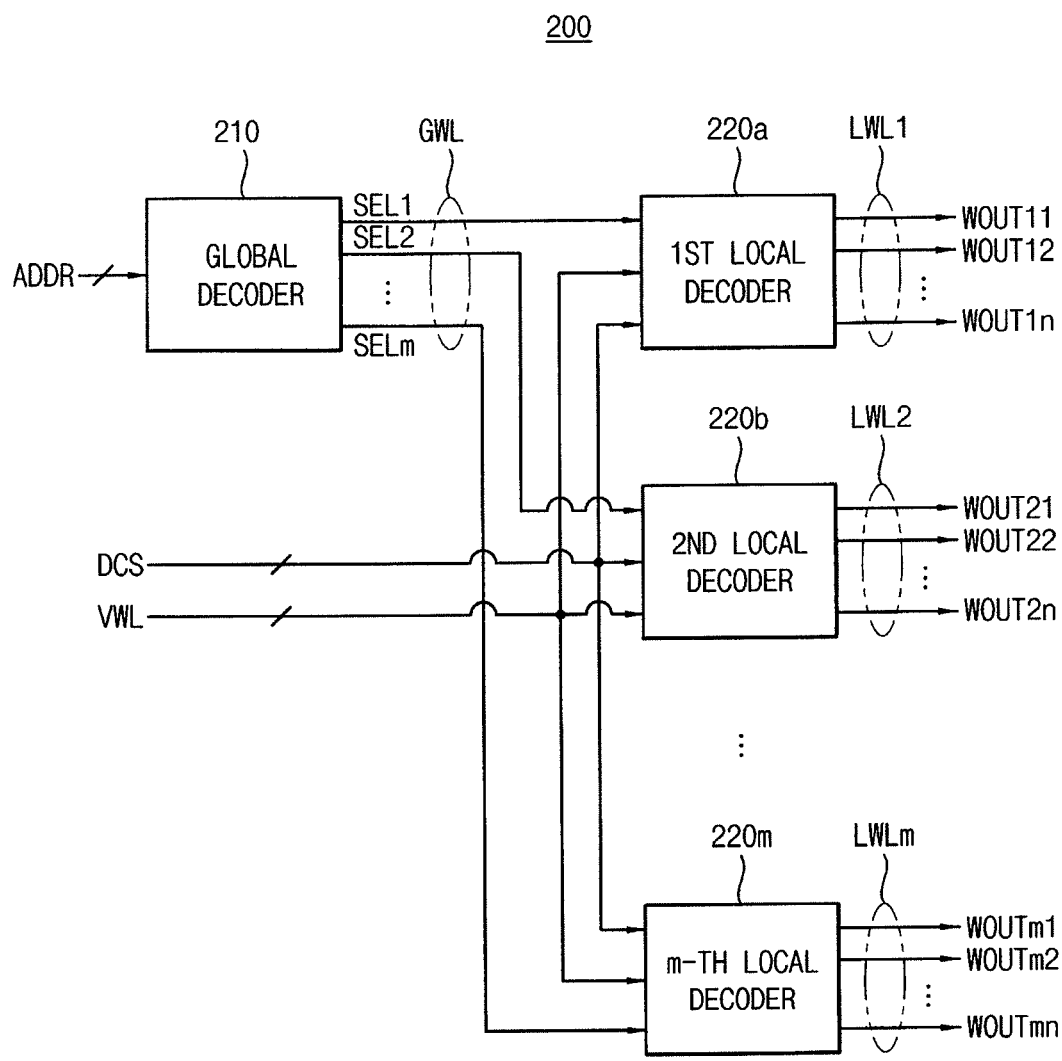
FIG. 5 is a block diagram illustrating a row decoder circuit according to exemplary embodiments of the inventive concept.

FIG. 5 is a block diagram illustrating a row decoder circuit according to exemplary embodiments of the inventive concept.

Referring to FIG. 5, the row decoder circuit 200 includes a global decoder 210 and a plurality of local decoders 220a, 220b, ..., 220m. The row decoder circuit 200 has a hierarchical structure. For example, wordlines of the row decoder circuit 200 in the non-volatile memory device may have a hierarchical structure including a local wordline connected to a predetermined number of memory cells and a global wordline connected in common to a plurality of the local wordlines.

The global decoder 210 selects one of global wordlines GWL based on an address signal ADDR, and generates selection signals SEL1, SEL2, ..., SELm corresponding to the global wordlines GWL. One of the selection signals SEL1 through SELm that corresponds to the selected global wordline may be activated. For example, the global decoder 210 may select a first global wordline of the global wordlines GWL based on the address signal ADDR, and may activate a first selection signal SEL1. The global decoder 210 may select an m-th global wordline of the global wordlines GWL based on the address signal ADDR, and may activate an m-th selection signal SELm, where m is a natural number equal to or greater than two. The global decoder 210 may include at least one logic element that performs a logic operation on the address signal ADDR.

Each of the local decoders 220a through 220m is connected to a respective one of the global wordlines GWL, and provides respective wordline driving signals WOUT11, WOUT12, ..., WOUT1n, WOUT21, WOUT22, ..., WOUT2n, ..., WOUTm1, WOUTm2, ..., WOUTmn to respective local wordlines LWL1, LWL2, ..., LWLm based on a respective one of the selection signals SEL1 through SELm, wordline voltages VWL and driving control signals DCS. For example, a first local decoder 220a may be connected to the first global wordline, and may provide wordline driving signals WOUT11, WOUT12, ..., WOUT1n to first local wordlines LWL1 based on the first selection signal SEL1, the wordline voltages VWL and the driving control signals DCS. An m-th local decoder 220m may be connected to the m-th global wordline, and may provide wordline driving signals WOUTm1, WOUTm2, ..., WOUTmn to m-th local wordlines LWLm based on the m-th selection signal SELm, the wordline voltages VWL and the driving control signals DCS.

Each of the local decoders 220a through 220m includes a decoding unit and a plurality of wordline driving units, and has substantially the same structure as the row decoder circuit 100 of FIG. 1, respectively. For example, the first local decoder 220a may include a first decoding unit (e.g., 110 of FIG. 1) and a plurality of first wordline driving units (e.g., 120a to 120n of FIG. 1). The first decoding unit may generate a first driving signal DS1 and a second driving signal DS2 based on the first selection signal SEL1 and the wordline voltages VWL. The first driving signal DS1 and the second driving signal DS2 may be changed depending on the operation modes of the non-volatile memory device. As described above, the operation modes may include the program mode and the erase mode. The plurality of first wordline driving units may include transistors (e.g., only two PMOS transistors) of a single transistor type. Each of the first wordline driving units may be connected to a respective one of the first local wordlines LWL1 and may output one of the first driving signal DS1 and the second driving signal DS2 as a respective one of the wordline driving signals WOUT11, WOUT12, ..., WOUT1n based on the driving control signals DCS. Each of the driving control signals DCS may have a voltage level that is lower than a voltage level of the first driving signal DS1 or is about the same as a voltage level of the second driving signal DS2 depending on whether the respective one of the first local wordlines LWL1 is selected.

In an exemplary embodiment of the inventive concept, the voltage levels of the first and second driving signals generated from each decoding unit may be changed depending on the operation modes of the non-volatile memory device and whether the respective one of the global wordlines GWL is selected. For example, when the first global wordline is selected in the program mode, the second driving signal generated by the first decoding unit may have a first program voltage level (e.g., about 10V). When the first global wordline is unselected in the program mode, the second driving signal generated by the first decoding unit may have a second program voltage level (e.g., about 0V). The first driving signal generated by the first decoding unit may have the second program voltage level in the program mode, regardless of whether the first global wordline is selected. In addition, when the first global wordline is selected in the erase mode, the first driving signal generated by the first decoding unit may have a first erase voltage level (e.g., about −6V). When the first global wordline is unselected in the erase mode, the second driving signal generated by the first decoding unit may have a second erase voltage level (e.g., about 6V). The second driving signal generated by the first decoding unit may have the second erase voltage level in the erase mode, regardless of whether the first global wordline is selected.

The row decoder circuit 200 according to exemplary embodiments of the inventive concept may reduce an operation time and an access time because of the hierarchical structure. In addition, each local decoder in the row decoder circuit 200 includes the plurality of wordline driving units having transistors of a single transistor type, and outputs the wordline driving signals based on the driving control signals. The driving control signals may be lower than the first driving signal or may be about the same as the second driving signal depending on whether the respective one of the local wordlines is selected. Thus, the row decoder circuit 200 may have a relatively simple structure and low power consumption, and may provide program voltages or erase voltages to the local wordlines depending on whether the respective one of the local wordlines is selected.

Figure 6:
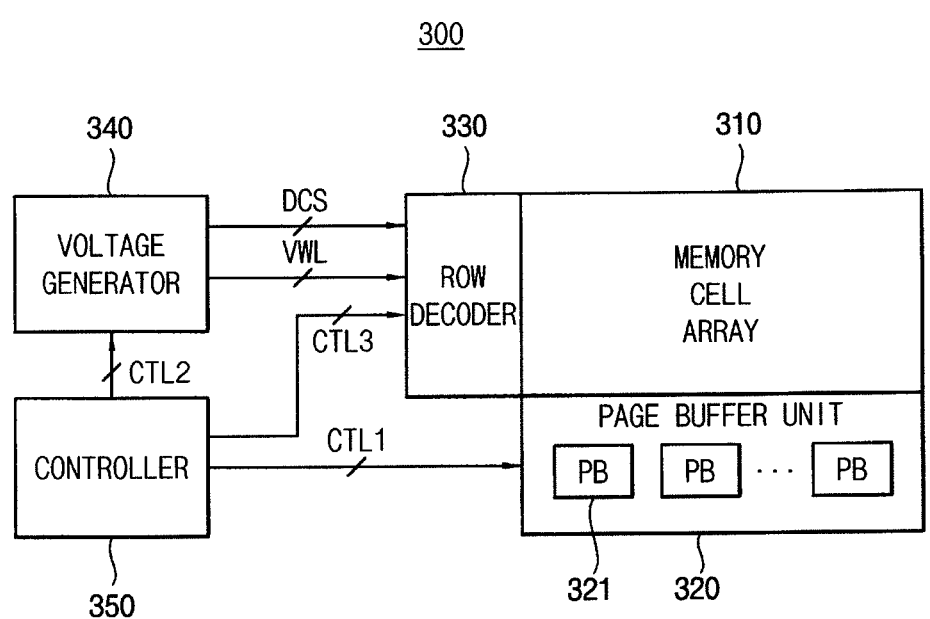
FIG. 6 is a block diagram illustrating a non-volatile memory device according to exemplary embodiments of the inventive concept.

FIG. 6 is a block diagram illustrating a non-volatile memory device according to exemplary embodiments of the inventive concept.

Referring to FIG. 6, the non-volatile memory device 300 includes a memory cell array 310, a page buffer unit 320, a row decoder circuit 330, a voltage generator 340 and a controller 350.

The memory cell array 310 may include a plurality of memory cells each of which is connected to a respective one of wordlines and a respective one of bitlines. In an exemplary embodiment of the inventive concept, the plurality of memory cells may include NAND flash memory cells or NOR flash memory cells. Cell transistors may be connected in series between a bitline and a source line in a NAND flash memory device, and cell transistors may be connected in parallel between a bitline and a source line in a NOR flash memory device. In an exemplary embodiment of the inventive concept, the plurality of memory cells may be connected to a common source line. In an exemplary embodiment of the inventive concept, the plurality of memory cells may be either single-level memory cells (SLC) in which only one bit is stored in each memory cell or multi-level memory cells (MLC) in which more than two bits are stored in each memory cell. The MLC may be programmed using various program methods, such as a shadow program method, a reprogram method or a on-chip buffered program method.

The voltage generator 340 may generate wordline voltages VWL and driving control signals DCS applied to the wordlines depending on the operation mode of the non-volatile memory device 300. The voltage generator 340 may generate the wordline voltages VWL and the driving control signals DCS based on control signals CTL2 provided from the controller 350. The wordline voltages VWL may include a first program voltage, a second program voltage, a first erase voltage and a second erase voltage, and may further include a pass voltage, a verify voltage, a read voltage, etc.

The row decoder circuit 330 may select a wordline based on a row address, and consequently, a plurality of memory cells connected to the selected wordline are selected. The row decoder circuit 330 may provide wordline driving signals to the plurality of wordlines based on the wordline voltages VWL and the driving control signals DCS. For example, the row decoder circuit 330 may provide the wordline driving signal having the first program voltage level to the selected wordline in the program mode, and may provide the wordline driving signal having the first erase voltage level to the selected wordline in the erase mode.

In an exemplary embodiment of the inventive concept, the row decoder circuit 330 may be the row decoder circuit 100 of FIG. 1. For example, the row decoder circuit 330 may include a decoding unit (e.g., 110 of FIG. 1) and a plurality of wordline driving units (e.g., 120a to 120n of FIG. 1). The decoding unit may generate a first driving signal and a second driving signal based on a selection signal and the wordline voltages VWL. The first driving signal and the second driving signal may be changed depending on the operation modes of the non-volatile memory device 300. The plurality of wordline driving units may include transistors of a single transistor type. Each of the wordline driving units may be connected to a respective one of the wordlines, and may output one of the first driving signal and the second driving signal as a respective one of the wordline driving signals based on a respective two of the driving control signals DCS. Each of the driving control signals DCS may have a voltage level that is lower than a voltage level of the first driving signal or is about the same as a voltage level of the second driving signal depending on whether the respective one of the wordlines is selected.

In an exemplary embodiment of the inventive concept, the row decoder circuit 330 may be the row decoder circuit 200 of FIG. 5. For example, the row decoder circuit 330 may include a global decoder (e.g., 210 of FIG. 5) and a plurality of local decoders (e.g., 220a to 220m of FIG. 5). The global decoder may select one of global wordlines based on an address signal, and may generate selection signals corresponding to the global wordlines. Each of the local decoders may be connected to a respective one of the global wordlines, and may provide respective wordline driving signals to respective local wordlines based on a respective one of the selection signals, the wordline voltages VWL and the driving control signals DCS.

The page buffer unit 320 may be connected to the bitlines, and may store data to be written in the memory cell or data read out from the memory cell. The page buffer unit 320 may include a plurality of page buffers 321 that are disposed corresponding to the bitlines and include a plurality of data latches. The page buffer unit 320 may operate as a sense amplifier or a write driver depending on the operation modes of the non-volatile memory device 300. For example, the page buffer unit 320 may operate as the sense amplifier during the read mode of the non-volatile memory device 300, and may operate as the write driver during the program mode of the non-volatile memory device 300. The page buffer unit 320 may further provide a function of a column decoder that selects the bitlines, and may further provide a function of a pass-fail detector that verifies threshold voltages, according to exemplary embodiments of the inventive concept. The controller 350 may generate control signals CTL1, CTL2 and CTL3 to control the page buffer unit 320, the voltage generator 340 and the row decoder circuit 330, respectively.

Figure 7:
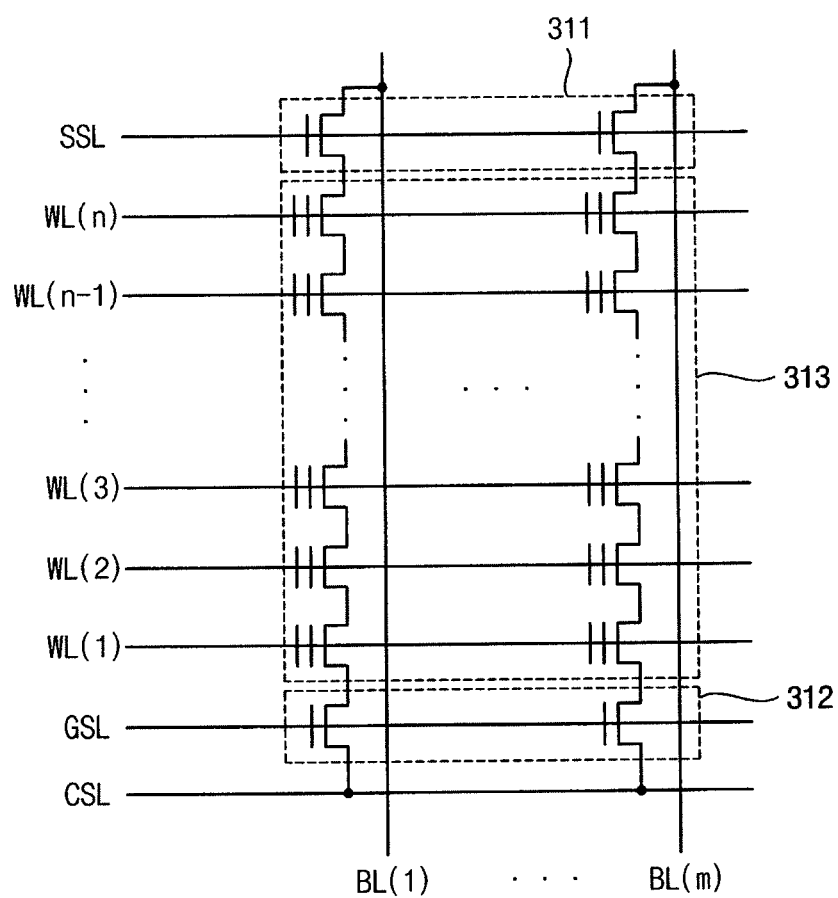
FIG. 7 is a circuit diagram illustrating a memory cell array included in the non-volatile memory device of FIG. 6, according to an exemplary embodiment of the inventive concept.

FIG. 7 is a circuit diagram illustrating a memory cell array included in the non-volatile memory device of FIG. 6, according to an exemplary embodiment of the inventive concept.

Referring to FIG. 7, the memory cell array 310 may include string select transistors 311, ground select transistors 312 and memory cells 313. In an exemplary embodiment of the inventive concept, the memory cells 313 may be arranged in a two-dimensional array structure. In an exemplary embodiment of the inventive concept, the memory cells 313 may be arranged in a three-dimensional vertical array structure.

The string select transistors 311 may be connected to bitlines BL(1) through BL(m), and the ground select transistors 312 may be connected to a common source line CSL. The memory cells 313 may be connected in series between the string select transistors 311 and the ground select transistors 312. The memory cells 313 in the same row may be connected to the same wordline among wordlines WL(1) through WL(n). For example, 16, 32 or 64 wordlines may be disposed between a string select line SSL and a ground select line GSL. The string select transistors 311 may be connected to the string select line SSL, and may be controlled by a voltage on the string select line SSL. The ground select transistors 312 may be connected to the ground select line GSL, and may be controlled by a voltage on the ground select line GSL. The memory cells 313 may be controlled by a voltage on the wordlines WL(1) through WL(n). In an exemplary embodiment of the inventive concept, the memory cells 313 may include the MLC.

In an exemplary embodiment of the inventive concept, each page buffer included in a page buffer unit may be connected to an odd-numbered bitline and an even-numbered bitline. In this case, the odd-numbered bitlines may form odd-numbered pages, the even-numbered bitlines may form even-numbered pages, and program operations for the odd-numbered pages and the even-numbered pages may be alternately performed.

Figure 8:
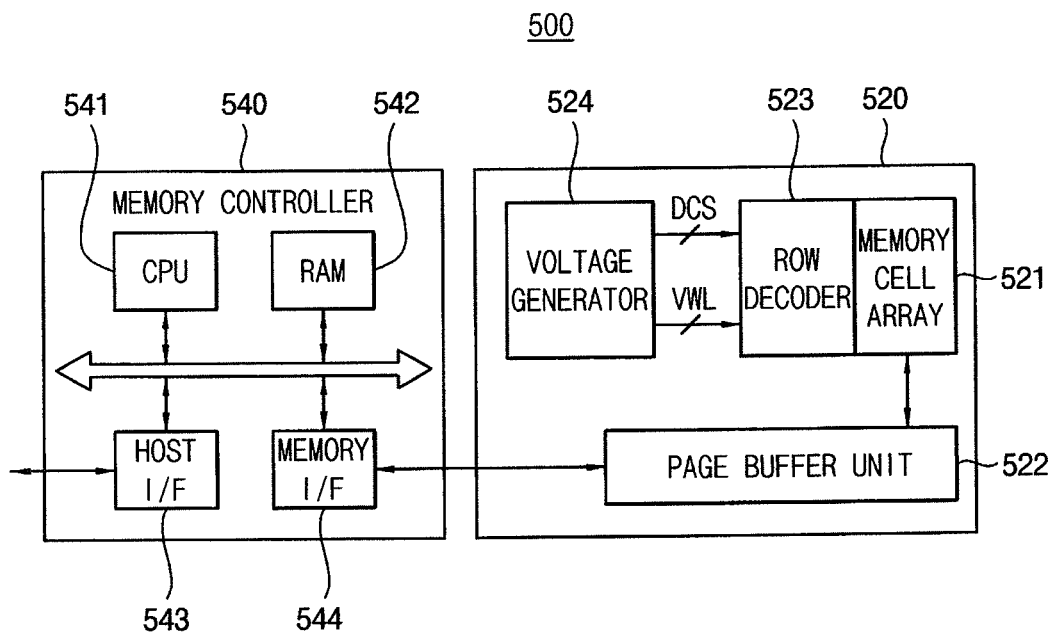
FIG. 8 is a block diagram illustrating a memory system including the non-volatile memory device of FIG. 6, according to an exemplary embodiment of the inventive concept.

FIG. 8 is a block diagram illustrating a memory system including the non-volatile memory device of FIG. 6, according to an exemplary embodiment of the inventive concept.

Referring to FIG. 8, the memory system 500 may include a non-volatile memory device 520 and a memory controller 540.

The non-volatile memory device 520 may be the non-volatile memory device 300 of FIG. 6. The non-volatile memory device 520 may include a memory cell array 521, a page buffer unit 522, a row decoder circuit 523 and a voltage generator 524. The non-volatile memory device 520 may further include a controller (not illustrated) as illustrated in FIG. 6. In an exemplary embodiment of the inventive concept, the non-volatile memory device 520 may further include a pass-fail detector (not illustrated) for verifying threshold voltage states. The non-volatile memory device 520 may be, but not limited to, a NAND flash memory device or a NOR flash memory device.

The row decoder circuit 523 may be the row decoder circuit 100 of FIG. 1 or the row decoder circuit 200 of FIG. 5. The row decoder circuit 523 may include a plurality of wordline driving units having transistors (e.g., two PMOS transistors) of a single transistor type, and outputs the wordline driving signals based on the driving control signals. The driving control signals may be lower than the first driving signal or may be about the same as the second driving signal depending on whether the respective one of the wordlines is selected. Thus, the row decoder circuit 523 may have a relatively simple structure and low power consumption, and may provide program voltages or erase voltages to the wordlines depending on whether the respective one of the wordlines is selected.

The memory controller 540 may include a central processing unit (CPU) 541, a memory unit 542, a host interface 543, and a memory interface 544. The memory controller 540 may control the non-volatile memory device 520, and may transfer data between external host devices and the non-volatile memory device 520.

The CPU 541 may control the memory unit 542, the host interface 543, and the memory interface 544 for processing and transferring data. The memory unit 542 may temporarily store data provided from the external host devices, or data provided from the non-volatile memory device 520. For example, the memory unit 542 may be implemented with a dynamic random access memory (DRAM) device, a static random access memory (SRAM) device, a phase-change random access memory (PRAM) device, a ferroelectric random access memory (FRAM) device, a resistive random access memory (RRAM) device, and/or a magnetic random access memory (MRAM) device. The host interface 543 enables communication with the external host devices, and the memory interface 544 enables communication with the non-volatile memory device 520. In addition, the CPU 541 may control the non-volatile memory device 520 via the memory interface 544.

In an exemplary embodiment of the inventive concept, the host interface 543 may interact with the external host devices using a standard protocol, such as universal serial bus (USB), multimedia card (MMC), peripheral component interconnect (PCI), peripheral component interconnect express (PCI-EXPRESS), advanced technology attachment (ATA), serial advanced technology attachment (SATA), parallel advanced technology attachment (PATA), small computer system interface (SCSI), enhanced small disk interface (ESDI), serial attached small computer system interface (SAS), integrated drive electronics (IDE), or the like. The memory interface 544 may interact with the non-volatile memory device 520 using a standard protocol, such as NAND interface protocol. The memory controller 540 may be included in the non-volatile memory device 520, for example. The non-volatile memory device 520 having the built-in memory controller 540 may be referred to as a One-NAND memory device.

In exemplary embodiments of the inventive concept, the memory system 500 may be incorporated into a memory card, a solid state drive (SSD), or other potentially standalone memory product. The non-volatile memory device 520 and/or the memory controller 540 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 9:
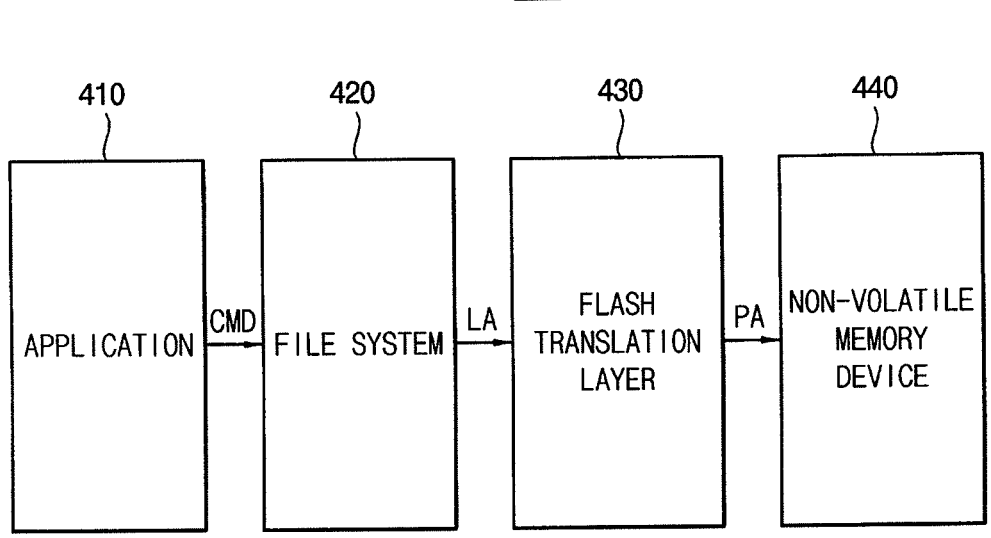
FIG. 9 is a block diagram illustrating a device driver for managing the memory system of FIG. 8, according to an exemplary embodiment of the inventive concept.

FIG. 9 is a block diagram illustrating a device driver for managing the memory system of FIG. 8, according to an exemplary embodiment of the inventive concept.

Referring to FIG. 9, the device driver (e.g., a software configuration) 400 for managing the memory system 500 of FIG. 8 may include an application 410, a file system 420, a flash translation layer 430 and a non-volatile memory device 440. Although FIG. 9 illustrates the non-volatile memory device 440, the device driver according to exemplary embodiments of the present inventive concept is not limited thereto, and may be applied to various semiconductor memory devices that write data into a memory cell array on a page basis.

The software configuration 400 of the memory system 500 of FIG. 8 may have a hierarchical structure in the order of the application 410, the file system 420, the flash translation layer 430 and the non-volatile memory device 440. For example, if the application 410 generates a command CMD required to perform an operation, the file system 420 may output a logical address LA based on the command CMD to access memory cells in the non-volatile memory device 440. The flash translation layer 430 may receive the logical address LA from the file system 420, may convert the logical address LA into a physical address PA based on an internal address mapping table, and may provide the physical address PA to the non-volatile memory device 440. In an exemplary embodiment of the inventive concept, the address mapping table may include a block mapping table for converting a logical block number into a physical block number and/or a page mapping table for converting a logical page number into a physical page number. The non-volatile memory device 440 may access the respective memory cells based on the physical address PA provided from the flash translation layer 430. Address mapping of the flash translation layer 430 may be classified according to a unit of mapping. For example, the address mapping of the flash translation layer 430 may be classified into a page mapping that performs the address mapping on a page basis, a block mapping that performs the address mapping on a block basis and a mixed mapping that performs the page mapping and the block mapping.

Figure 10:
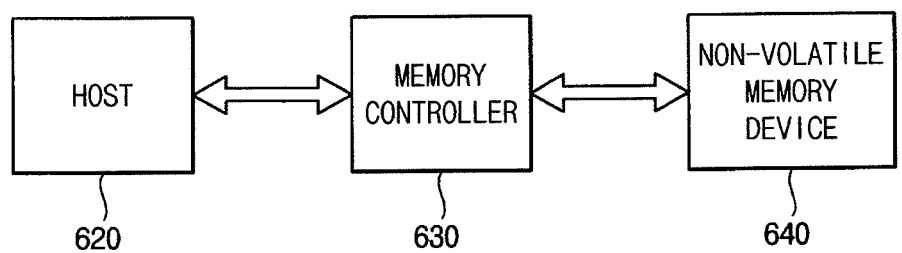
FIGS. 10, 11 and 12 are block diagrams illustrating the memory system of FIG. 8, according to exemplary embodiments of the inventive concept.
Figure 11:
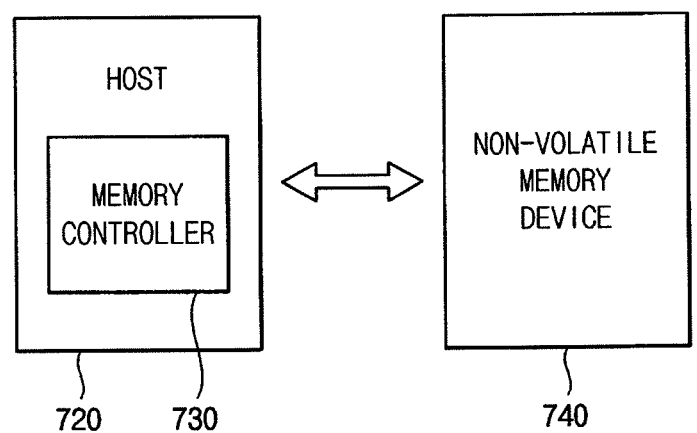
Figure 12:
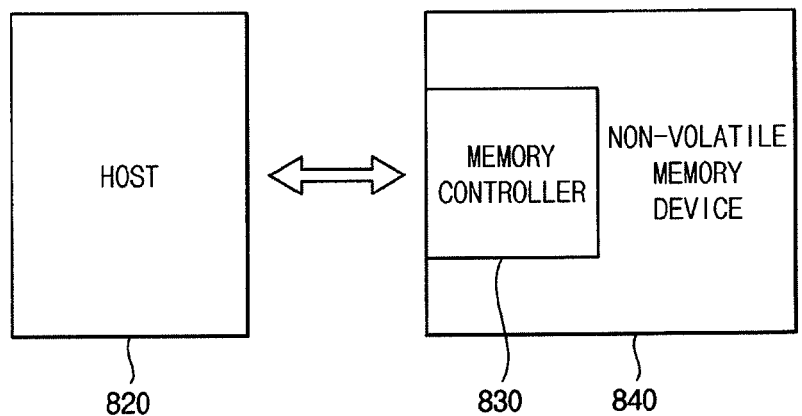

FIGS. 10, 11 and 12 are block diagrams illustrating the memory system of FIG. 8, according to exemplary embodiments of the inventive concept.

Referring to FIG. 10, a memory system 600 may include a host device 620, a memory controller 630 and one or more non-volatile memory devices 640.

The memory controller 630 may be located between the host device 620 and the non-volatile memory devices 640. The memory controller 630 and the non-volatile memory devices 640 may communicate with each other through a single channel or multiple channels. The memory controller 630 may be implemented as a separate device from the host device 620 and the non-volatile memory devices 640, and may include a CPU 541, a memory unit 542, a host interface 543 and a memory interface 544 as illustrated in FIG. 8.

In an exemplary embodiment of the inventive concept, the host interface 543 may interact with the host device 620 using a standard protocol, such as USB, MMC, PCI, PCI-EXPRESS, ATA, SATA, PATA, SCSI, ESDI, SAS, IDE, or the like. The memory interface 544 may interact with the non-volatile memory devices 640 using a standard protocol, such as NAND interface protocol. Such an implementation may allow the memory controller 630 to employ the standard protocols between the host device 620 and the host interface 543 and between the NAND flash memory devices 640 and the memory interface 544.

Referring to FIG. 11, a memory system 700 may include a host device 720 having a built-in memory controller 730, and one or more non-volatile memory devices 740.

The memory controller 730 may be located in the host device 720. The memory controller 730 and the non-volatile memory devices 740 may communicate with each other through a single channel or multiple channels. Since the memory controller 730 is built in the host device 720, the memory controller 730 may not include a host interface 543 illustrated in FIG. 8, or may interact with the host device 720 using an unstandardized protocol. Further, the memory controller 730 may not include a CPU 541 illustrated in FIG. 8, and a host processor of the host device 720 may perform the function of the CPU 541.

In an exemplary embodiment of the inventive concept, the host interface 543 may interact with the host device 720 using an unstandardized protocol, and a memory interface 544 may interact with the NAND flash memory devices 740 using a standard protocol. Thus, an appropriate protocol can be used between the host device 720 and the memory controller 730, and the interaction between these devices can be performed inside the host device 720, thereby resulting in fast operations.

Referring to FIG. 12, a memory system 800 may include a host device 820 and one or more non-volatile memory devices 840, each having a built-in memory controller 830.

The memory controller 830 may be located in each non-volatile memory device 840. The memory controller 830 and the non-volatile memory devices 840 may communicate with each other through a single channel or multiple channels. Since the memory controller 830 is built in each non-volatile memory device 840, the memory controller 830 may not include a memory interface 544 illustrated in FIG. 8, or may interact with the non-volatile memory devices 840 using an unstandardized protocol. Further, a CPU 541 of the memory controller 830 may control the non-volatile memory devices 840.

In an exemplary embodiment of the inventive concept, a host interface 543 may interact with the host device 820 using an standard protocol, such as USB, MMC, PCI, PCI-EXPRESS, ATA, SATA, PATA, SCSI, ESDI, SAS, IDE, etc., and the memory interface 544 may interact with the non-volatile memory devices 840 using an unstandardized protocol. Thus, an appropriate protocol can be used between the non-volatile memory devices 840 and the memory controller 830, and the interaction between these devices can be performed inside the non-volatile memory devices 840, thereby resulting in fast operations.

Figure 13:
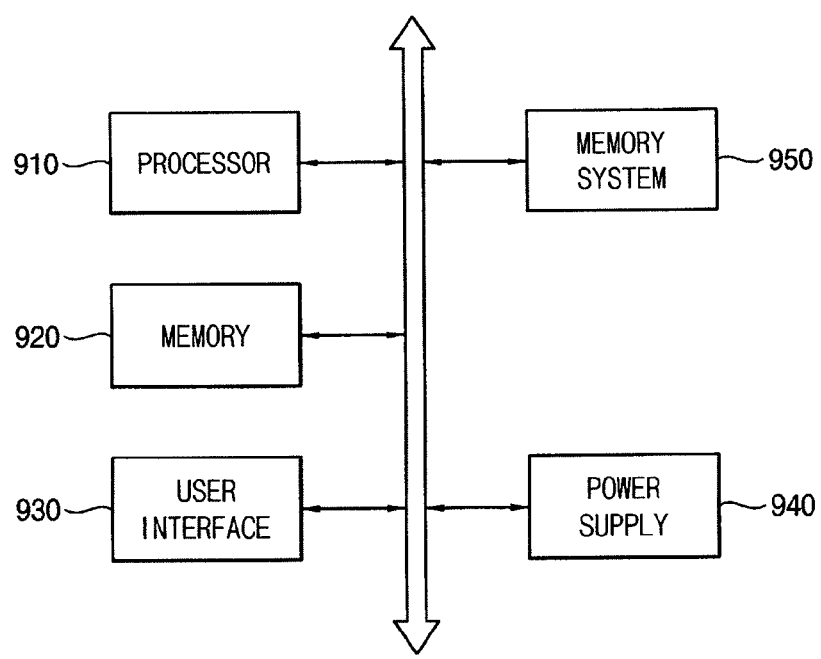
FIG. 13 is a block diagram illustrating a computing system including the memory system of FIG. 8, according to an exemplary embodiment of the inventive concept.

FIG. 13 is a block diagram illustrating a computing system including the memory system of FIG. 8, according to an exemplary embodiment of the inventive concept.

Referring to FIG. 13, a computing system 900 includes a processor 910, a memory device 920, a user interface 930, a power supply 940, and a memory system 950.

The processor 910 performs calculations, or computing functions for various tasks. For example, the processor 910 may be a microprocessor or a CPU. The processor 910 may be coupled to the memory device 920 via an address bus, a control bus, and/or a data bus. For example, the memory device 920 may be implemented by a DRAM device, a SRAM device, a PRAM device, a FRAM device, a RRAM device, and/or a MRAM device. The processor 910 may be coupled to an extended bus, such as a PCI bus. The processor 910 may control the user interface 930 having at least one input device (e.g., a keyboard, a mouse, etc.) and at least one output device (e.g., a printer, a display device, etc.). The power supply 940 supplies operation voltages for the computing system 900. According to exemplary embodiments of the inventive concept, the computing system 900 may further include an application chipset, a camera image processor (CIS), or the like. The memory system 950 may include a non-volatile memory device 520 and a memory controller 540 illustrated in FIG. 8.

The above described exemplary embodiments of the inventive concept may be applied to a system having a non-volatile memory device (e.g., a flash memory device). Thus, the exemplary embodiments of the present inventive concept may be applied to a system, such as a desktop computer, a laptop computer, a digital camera, a video camcorder, a cellular phone, a smart phone, a portable media player (PMP), a personal digital assistant (PDA), an MP3 player, a digital television, an SSD, a navigation device, etc.

As described above, a row decoder circuit according to exemplary embodiments of the inventive concept may have a relatively simple structure and low power consumption because each of the wordline driving units includes transistors (e.g., only two PMOS transistors) of a single transistor type. In addition, the row decoder circuit may provide program voltages or erase voltages to the wordlines because the wordline driving signals are output based on the driving control signals that are lower than the first driving signal or the about same as the second driving signal depending on whether the respective one of the wordlines is selected.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A row decoder circuit, comprising:
  a decoding unit configured to generate a first driving signal and a second driving signal based on a selection signal and wordline voltages, wherein a voltage level of the first driving signal and a voltage level of the second driving signal depend on an operation mode;
  a first wordline driving unit connected to a first wordline and configured to output one of the first driving signal and the second driving signal as a first wordline driving signal based on first driving control signals; and
  a second wordline driving unit connected to a second wordline and configured to output one of the first driving signal and the second driving signal as a second wordline driving signal based on second driving control signals,
  wherein the first driving control signals each have a voltage level that is lower than the voltage level of the first driving signal or is about the same as the voltage level of the second driving signal depending on whether the first wordline is selected, and the second driving control signals each have a voltage level that is lower than the voltage level of the first driving signal or is about the same as the voltage level of the second driving signal depending on whether the second wordline is selected.

2. The row decoder circuit of claim 1, wherein the first wordline driving unit includes:
  a first p-type metal oxide semiconductor (PMOS) transistor having a first electrode connected to the first wordline, a gate electrode receiving a first control signal of the first driving control signals, and a second electrode receiving the first driving signal; and
  a second PMOS transistor having a first electrode receiving the second driving signal, a gate electrode receiving a second control signal of the first driving control signals, and a second electrode connected to the first electrode of the first PMOS transistor,
  wherein the second wordline driving unit includes:
  a third PMOS transistor having a first electrode connected to the second wordline, a gate electrode receiving a first control signal of the second driving control signals, and a second electrode receiving the first driving signal; and
  a fourth PMOS transistor having a first electrode receiving the second driving signal, a gate electrode receiving a second control signal of the second driving control signals, and a second electrode connected to the first electrode of the third PMOS transistor.

3. The row decoder circuit of claim 2, wherein the first control signal of the first or second driving control signals has one of a first voltage level and a second voltage level, and the second control signal of the first or second driving control signals has the other the of the first voltage level and the second voltage level, wherein the first voltage level is lower than the voltage level of the first driving signal and the second voltage level is about the same as the voltage level of the second driving signal.

4. The row decoder circuit of claim 1, wherein the operation mode includes a program mode, the first driving control signals include a first and a second control signal, and the second driving control signals include a first and a second control signal, and
  wherein the first wordline driving unit outputs the first driving signal as the first wordline driving signal in response to the first control signal of the first driving control signals having a program control voltage level when the first wordline is not selected in the program mode, and the second wordline driving unit outputs the first driving signal as the second wordline driving signal in response to the first control signal of the second driving control signals having the program control voltage level when the second wordline is not selected in the program mode, wherein the program control voltage level is lower than the voltage level of the first driving signal.

5. The row decoder circuit of claim 4, wherein the first wordline driving unit outputs the second driving signal as the first wordline driving signal in response to the second control signal of the first driving control signals having the program control voltage level when the first wordline is selected in the program mode, and the second wordline driving unit outputs the second driving signal as the second wordline driving signal in response to the second control signal of the second driving control signals having the program control voltage level when the second wordline is selected in the program mode.

6. The row decoder circuit of claim 5, wherein the second driving signal has a first program voltage level and the first driving signal has a second program voltage level in the program mode.

7. The row decoder circuit of claim 6, wherein the first control signal of the first driving control signals has the first program voltage level when the first wordline is selected in the program mode, the second control signal of the first driving control signals has the first program voltage level when the first wordline is not selected in the program mode, the first control signal of the second driving control signals has the first program voltage level when the second wordline is selected in the program mode, and the second control signal of the second driving control signals has the first program voltage level when the second wordline is not selected in the program mode.

8. The row decoder circuit of claim 1, wherein the operation mode includes an erase mode, the first driving control signals include a first and a second control signal, and the second driving control signals include a first and second control signal, and wherein the first wordline driving unit outputs the first driving signal as the first wordline driving signal in response to the first control signal of the first driving control signals having an erase control voltage level when the first wordline is selected in the erase mode, and the second wordline driving unit outputs the first driving signal as the second wordline driving signal in response to the first control signal of the second driving control signals having the erase control voltage level when the second wordline is selected in the erase mode, wherein the erase control voltage level is lower than the voltage level of the first driving signal.

9. The row decoder circuit of claim 8, wherein the first wordline driving unit outputs the second driving signal as the first wordline driving signal in response to the second control signal of the first driving control signals having the erase control voltage level when the first wordline is not selected in the erase mode, and the second wordline driving unit outputs the second driving signal as the second wordline driving signal in response to the second control signal of the second driving control signals having the erase control voltage level when the second wordline is not selected in the erase mode.

10. The row decoder circuit of claim 9, wherein the first driving signal has a first erase voltage level and the second driving signal has a second erase voltage level in the erase mode.

11. The row decoder circuit of claim 10, wherein the first control signal of the first driving control signals has the second erase voltage level when the first wordline is not selected in the erase mode, the second control signal of the first driving control signals has the second erase voltage level when the first wordline is selected in the erase mode, the first control signal of the second driving control signals has the second erase voltage level when the second wordline is not selected in the erase mode, and the second control signal of the second driving control signals has the second erase voltage level when the second wordline is selected in the erase mode.

12. The row decoder circuit of claim 1, wherein the decoding unit includes:

a first n-type metal oxide semiconductor (NMOS) transistor having a first electrode connected to a first node outputting the second driving signal, a gate electrode receiving the selection signal, and a second electrode connected to a ground voltage;

a second NMOS transistor having a first electrode connected to a second node outputting the first driving signal, a gate electrode receiving an inversion signal of the selection signal, and a second electrode connected to the ground voltage; and a latch unit connected between a first wordline voltage and a second wordline voltage, and connected to the first node and the second node.

13. The row decoder circuit of claim 1, wherein all transistors of the first and second wordline driving units are of the same type.

14. A row decoder circuit, comprising:

a global decoder configured to select one of global wordlines based on an address signal and configured to generate selection signals corresponding to the global wordlines;

first and second local decoders, wherein the first local decoder is connected to a first global wordline and configured to provide first wordline driving signals to first local wordlines based on a first selection signal, wordline voltages and a first set of driving control signals, the second local decoder is connected to a second global wordline and configured to provide second wordline driving signals to second local wordlines based on a second selection signal, the wordline voltages and a second set of driving control signals, and the first local decoder comprises:

a decoding unit configured to generate a first driving signal and a second driving signal based on the first selection signal and the wordline voltages, wherein a voltage level of the first driving signal and a voltage level of the second driving signal depend on an operation mode;

a first wordline driving unit connected to a first of the first local wordlines and configured to output one of the first driving signal and the second driving signal as a first of the first wordline driving signals based on first driving control signals of the first set of driving control signals; and a second wordline driving unit connected to a second of the first local wordlines and configured to output one of the first driving signal and the second driving signal as a second of the first wordline driving signals based on second driving signals of the first set of driving control signals, wherein the first driving control signals of the first set of driving control signals have a voltage level that is lower than the voltage level of the first driving signal or is about the same as the voltage level of the second driving signal depending on whether the first of the first local wordlines is selected, and the second driving control signals of the first set of driving control signals have a voltage level that is lower than the voltage level of the first driving signal or is about the same as the voltage level of the second driving signal depending on whether the second of the first local wordlines is selected.

15. The row decoder circuit of claim 14, wherein the operation mode includes a program mode, and wherein the second driving signal has a first program voltage level when the first global wordline is selected in the program mode and has a second program voltage level when the first global wordline is not selected in the program mode, and the first driving signal has the second program voltage level in the program mode.

16. The row decoder circuit of claim 14, wherein the operation mode includes an erase mode, and wherein the first driving signal has a first erase voltage level when the first global wordline is selected in the erase mode and has a second erase voltage level when the first global wordline is not selected in the erase mode, and the second driving signal has the second erase voltage level in the erase mode.

17. The row decoder circuit of claim 14, wherein all transistors of the first and second wordline driving units are of the same type.

18. A row decoder, comprising:

a decoding unit; and first and second word line driving units, wherein the decoding unit generates a first driving signal and a second driving signal based on a selection signal and wordline voltages, the first wordline driving unit outputs one of the first and second driving signals as a first wordline driving signal based on first driving control signals, the second wordline driving unit outputs one of the first and second driving signals as a second wordline driving signal based on second driving control signals, and all transistors of the first and second wordline driving units are of the same type, wherein a voltage level of each of the first driving control signals is lower than a voltage level of the first driving signal or is about the same as a voltage level of the second driving signal depending on whether a first wordline is selected, and a voltage level of each of the second driving control signals is lower than the voltage level of the first driving signal or is about the same as the voltage level of the second driving signal depending on whether a second wordline is selected.

19. The row decoder of claim 18, wherein a voltage level of the first driving signal and a voltage level of the second driving signal are determined according to an operating mode of a semiconductor device.

\* \* \* \* \*